United States Patent
Hanawa

(10) Patent No.: US 7,474,096 B2
(45) Date of Patent: Jan. 6, 2009

(54) MAGNETIC RESONANCE IMAGING APPARATUS

(75) Inventor: Masatoshi Hanawa, Otawara (JP)

(73) Assignees: Kabushiki Kaisha Toshiba, Tokyo (JP); Toshiba Medical Systems Corporation, Tochigi (JP)

( * ) Notice: Subject to any disclaimer, the term of this patent is extended or adjusted under 35 U.S.C. 154(b) by 0 days.

(21) Appl. No.: 11/656,524

(22) Filed: Jan. 23, 2007

(65) Prior Publication Data

US 2007/0170920 A1    Jul. 26, 2007

(30) Foreign Application Priority Data

Jan. 25, 2006    (JP)    ............................. 2006-016670

(51) Int. Cl.
*G01V 3/00*    (2006.01)

(52) U.S. Cl. ...................................... 324/306; 600/415

(58) Field of Classification Search ................ 600/415, 600/410; 324/306, 307, 309
See application file for complete search history.

(56) References Cited

U.S. PATENT DOCUMENTS

| 6,671,536 B2 * | 12/2003 | Mistretta | 600/410 |
| 6,963,768 B2 * | 11/2005 | Ho et al. | 600/415 |
| 7,003,344 B2 * | 2/2006 | Bolas et al. | 600/410 |

FOREIGN PATENT DOCUMENTS

| JP | 8-71056 | 3/1996 |
| JP | 8-131419 | 5/1996 |
| JP | 2002-95646 | 4/2002 |

* cited by examiner

*Primary Examiner*—Louis M Arana
(74) *Attorney, Agent, or Firm*—Nixon & Vanderhye PC

(57) ABSTRACT

A magnetic resonance imaging apparatus which applies RF pulses to a subject placed on a top board which is moving in an imaging field in which a static magnetic field and gradient magnetic fields are formed, acquiring magnetic resonance signals emitted from the subject as a result of application of the RF pulses, producing image data based on the acquired magnetic resonance signals, and stopping the generation of a drive signal to move the top board during a magnetic resonance signal acquisition interval.

22 Claims, 3 Drawing Sheets

MAGNETIC RESONANCE IMAGING APPARATUS

CROSS-REFERENCE TO RELATED APPLICATIONS

This application is based upon and claims the benefit of priority from prior Japanese Patent Application No. 2006-016670, filed Jan. 25, 2006, the entire contents of which are incorporated herein by reference.

BACKGROUND OF THE INVENTION

1. Field of the Invention

The present invention relates to a magnetic resonance imaging (MRI) apparatus which allows imaging of a large region of a subject by acquiring magnetic resonance (MR) signals while moving the subject in the direction of its body axis.

2. Description of the Related Art

The MRI method is an imaging method which involves exciting nuclear spins in tissues of a subject placed in a static magnetic field with a radio-frequency signal (RF pulses) having their Larmor frequency and reconstructing image data from magnetic resonance signals emitted as a result of the nuclear spins having been excited.

The MRI apparatus is an imaging diagnostic apparatus which allows imaging of a subject through the use of the MRI method. The MRI apparatus can obtain not only anatomical diagnostic information but also biochemical information, diagnostic function information, etc. For this reason, the MRI apparatus plays an increasingly important role in the field of today's imaging diagnosis.

FIG. 4 is a schematic illustration of the gantry of a conventional MRI apparatus. Around an imaging field 130a set in the center of the gantry 120a are arranged a main magnet 11a, a gradient field coil 21a, a transmit coil 31a and a receive coil 33a. The main magnet 11a and the gradient field coil 21a form a static magnetic field and gradient magnetic fields, respectively, to which a portion of a subject 150 placed in the imaging field is subjected. The transmit coil 31a applies the subject 150 with RF pulses. The receive coil 33a detects MR signals emitted from the subject as a result of application with the RF pulses.

A top board (i.e., a support) 4a on which the subject 150 is placed is mounted to the top of an examination couch (not shown) so as to be slidable in the direction of its length (the Z-axis direction). When the subject 150 is moved into the imaging field together with the top board 4a, a portion of the subject (a to-be-imaged region) is placed in the proximity of the receive coil 33a. In this case, the maximum imaging region is determined by the length D in the direction of Z axis of the receive coil 33a.

In recent years, to produce serial image data for a region which is even larger than the maximum imaging region, a method has been proposed which produces image data by reconstructing MR signals acquired while continuously moving the top board 4a in the direction of its length (see, for example, JP-A 8-71056 (KOKAI)).

According to the method proposed in this publication, by controlling the carrier frequency of selective excitation RF pulse to a given slice plane of the subject 150 in acquiring MR signals, MR signals from given to-be-imaged region of the subject in movement can be captured at all times by the same frequency, allowing image data for a large region of the subject to be produced.

In addition, an imaging method has also been proposed which allows multiple-slice imaging or oblique imaging as a result of further development of the above method (see, for example, JP-A 2002-95646 (KOKAI)).

As described already, the MRI apparatus applies to the subject 150 RF pulses having frequency components in a given band (for example, ±250 KHz) centered at a Larmor frequency of, say, 63.9 MHz and then receives from the subject MR signals having the same frequency components as the RF pulses to produce image data. The MR signals are signals of very low amplitude; therefore, it is required to remove noise having the same frequency components as much as possible. For this reason, the receive coil 33a to detect MR signals and the gantry 120 equipped with amplifiers to amplify the detected MR signals are installed in a shield room together with the examination couch.

In the production of image data for a large region of a subject which is continuously moved (large-volume imaging), there is a fear that electromagnetic noise caused by a drive signal to move the top board 4a gets mixed in MR signals detected by the receive coil 33a and consequently unacceptable artifacts are produced in image data obtained by reconstructing the MR signals.

In particular, with MRI apparatus structured such that the length D of the imaging field 130a of the gantry 120a is reduced and its aperture is made large in order to remove an uneasy feeling of the patient 150 moved into the imaging field, the receive coil 33a and the amplifiers are more susceptible to electromagnetic noise.

Besides the drive signal to move the top board 4a, there are other causes which allow electromagnetic noise to get mixed in MR signals.

BRIEF SUMMARY OF THE INVENTION

In view of such situations, it has been desired to reduce artifacts caused by electromagnetic noise.

According to a first aspect of the present invention, there is provided a magnetic resonance imaging apparatus which applies RF pulses to a subject placed on a top board which is moving in an imaging field in which a static magnetic field and gradient magnetic fields are formed; acquiring magnetic resonance signals emitted from the subject as a result of application of the RF pulses; producing image data based on the acquired magnetic resonance signals; and stopping the generation of a drive signal to move the top board during a magnetic resonance signal acquisition interval.

According to a second aspect of the present invention, there is provided a magnetic resonance imaging apparatus comprising: a magnetic field forming unit which forms a static magnetic field and gradient magnetic fields in the imaging field of magnetic resonance imaging; a top board on which a subject is placed; a top board moving unit which moves the top board; a transmitting and receiving unit which applies RF pulses to a to-be-imaged region of the subject positioned in the imaging field and receives magnetic resonance signals emitted from the to-be-imaged region of the subject; an image data producing unit which produces image data on the basis of the magnetic resonance signals; and a drive signal generator which generates a drive signal for driving the top board moving unit so as to cause the top board to move and stops the generation of the drive signal during an interval in which the magnetic resonance signals are received by the transmitting and receiving unit.

According to a third aspect of the present invention, there is provided a magnetic resonance imaging apparatus comprising: an application unit which applies gradient magnetic fields and radio-frequency pulses to a subject placed in a static magnetic field in order to emit magnetic resonance signals from the subject; a couch which causes a top board on which the subject is placed to move in a longitudinally direction of the top board; a radio-frequency coil which detects the magnetic resonance signals; a data acquisition unit which acquires the magnetic resonance signals detected by the radio-frequency coil; a reconstruction unit which reconstructs a magnetic resonance image on the basis of the magnetic resonance signals acquired by the data acquisition unit; and a controller which controls the application unit and the data acquisition unit so as to acquire the magnetic resonance signals while a drive signal to drive the top board is turned off.

According to a fourth aspect of the present invention, there is provided a magnetic resonance imaging apparatus comprising: an application unit which applies gradient magnetic fields and radio-frequency pulses to a subject placed in a static magnetic field in order to emit magnetic resonance signals from the subject; a couch which causes a top board on which the subject is laid down to move in the direction of its length; a radio-frequency coil which detects the magnetic resonance signals; a data acquisition unit which acquires the magnetic resonance signals detected by the radio-frequency coil; a reconstruction unit which reconstructs a magnetic resonance image on the basis of the magnetic resonance signals acquired by the data acquisition unit; and a controller which controls the application unit, the couch and the data acquisition unit so as to acquire the magnetic resonance signals while moving the top board, the couch being controlled so as not to generate a drive signal to move the top board during an interval in which the magnetic resonance signals are acquired by the data acquisition unit.

According to a fifth aspect of the present invention, there is provided a magnetic resonance imaging apparatus which applying RF pulses to a subject placed on a top board which is moving in an imaging field in which a static magnetic field and gradient magnetic fields are formed; acquiring magnetic resonance signals emitted from the subject as a result of application of the RF pulses; producing image data based on the acquired magnetic resonance signals; and stopping an operation which involves generation of noise in the magnetic resonance signals during a magnetic resonance signal acquisition interval.

According to a sixth aspect of the present invention, there is provided a magnetic resonance imaging apparatus comprising: a magnetic field forming unit which forms a static magnetic field and gradient magnetic fields in the imaging field of the magnetic resonance imaging; a transmitting and receiving unit which applies RF pulses to a to-be-imaged region of a subject positioned in the imaging field and receives magnetic resonance signals emitted from the to-be-imaged region of the subject; an image data producing unit which produces image data on the basis of the magnetic resonance signals; and an operation unit which involves an operation which causes noise to be generated in the magnetic resonance signals, the operation being stopped during an interval in which the magnetic resonance signals are received by the transmitting and receiving unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An MRI apparatus 200 according to an embodiment will be described hereinafter with reference to the accompanying drawings.

The feature of the MRI apparatus 200 is to prevent electromagnetic noise due to top board drive signals from getting mixed in MR signals in the following manner. That is, the MRI apparatus 200 collects MR signals while a subject placed on the top board is moved almost continuously at a given speed in the direction of its body axis in the imaging field in which a static magnetic field, gradient magnetic fields and a radio-frequency (RF) magnetic field are formed. The MRI apparatus 200 reconstructs image data for a larger body region than the imaging field based on MR signals obtained in time sequence from a number of to-be-imaged regions (imaging regions) of the subject. In such an imaging process, the MRI apparatus 200 controls the production of a drive signal on the basis of information on the timing of MR signal acquisition (for example, information on the timing of starting of acquisition and the timing of ending of acquisition).

In the description which follows, the MRI apparatus 200 will be described as using the spin echo (SE) method to collect MR signals. However, it should be noted that another imaging method, such as the field echo (FE) method, the echo planar imaging (EPI) method, or the inversion recovery (IR) method, may be used.

The configuration of the MRI apparatus 200 will be described below with reference to FIG. 1, which shows, in block diagram form, the entire configuration of the MRI apparatus.

Figure 1:
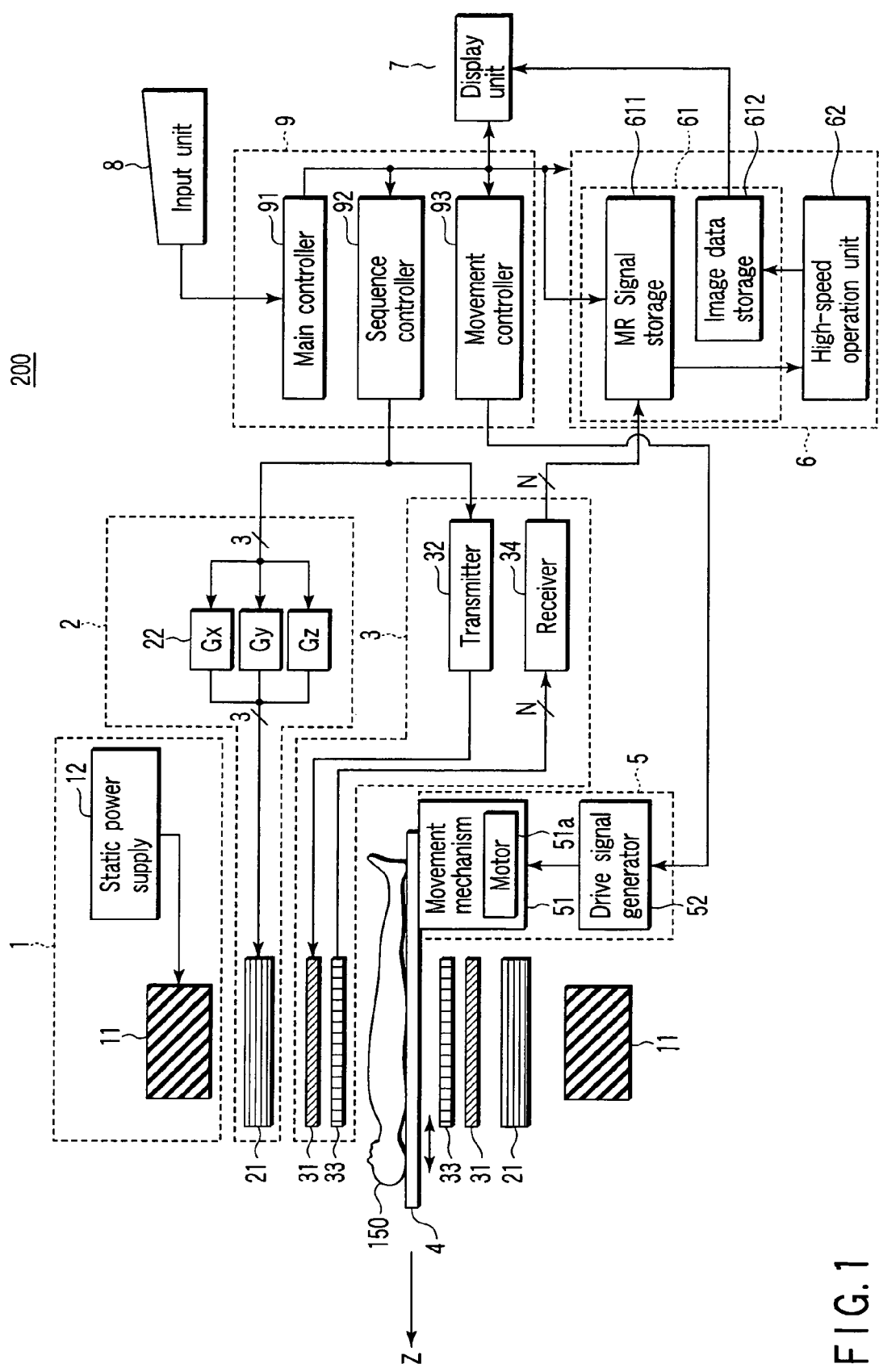
FIG. 1 is a schematic block diagram of an MRI apparatus according to an embodiment.

The MRI apparatus 200 shown in FIG. 1 includes a static magnetic field generator 1, a gradient magnetic field generator 2, a transmitting and receiving unit 3, a top board 4, a top board moving unit 5, an image data producing unit 6, a display unit 7, an input unit 8, and a controller 9.

The static magnetic field generator 1 includes a main magnet 11 and a static power supply 12. The main magnet 11 is a superconductive or non-superconductive magnet. The static power supply 12 supplies the main magnet 11 with a current. The static magnetic field generator 1 forms a strong static magnetic field within the imaging field of a gantry not shown in FIG. 1 (see FIG. 4). As the main magnet 11 use may be made of a permanent magnet. In that case, the static power supply 12 is not needed.

The gradient magnetic field generator 2 includes a gradient field coil 21 and a gradient power supply 22. The gradient field coil 21 is formed by combining three coils corresponding to mutually orthogonal X, Y and Z axes. The gradient power supply 22 supplies each of the three coils of the gradient field coil 21 with a pulsed current. The gradient field generator 2 thus configured superimposes gradient magnetic fields each of which has its strength varied along a respective corresponding one of the X, Y and Z axes on the static magnetic field. The gradient power supply 22 performs encoding on the imaging field on the basis of a sequence control signal from the controller 9. That is, the gradient power supply 22 separately adjusts the distribution of magnetic field strength for each of the three axes by controlling pulsed currents supplied to the three coils of the gradient field coil 21 in accordance with the sequence control signal. Thereby, a slice-selection gradient field Gs, a phase-encoding gradient field Ge and a readout (frequency-encoding) gradient field Gr which are mutually orthogonal are formed in their respective desired directions.

The transmitting and receiving unit 3 includes a transmit coil 31, a transmitter 32, a receive coil 33, and a receiver 34.

The transmit coil 31 receives RF pulse signals from the transmitter 32 to transmit RF pulses into the imaging field. Based on a sequence control signal from the controller 9, the transmitter 32 produces RF pulsed currents such that a carrier wave of the same frequency as a magnetic resonance frequency (Larmor frequency) dependent on the strength of the static magnetic field produced by the main magnet 11 is modulated with a given selective excitation waveform. The receive coil 33 detects MR signals emitted from the subject and sends them to the receiver 34. To detect the MR signals with high sensitivity, it is desirable to use an array coil in which a number of (N number of) coils of small diameter is arranged. The receiver 34 is equipped with an amplifier, an intermediate frequency converter, a phasedetector, an analog-to-digital (A/D) converter, and a filtering circuit for each of N channels. The receiver 34 amplifies MR signals detected by the receive coil 33 and then subjects the amplified MR signals to signal processes, such as intermediate frequency conversion, phase detection, filtering, and A/D conversion. The amplifiers are usually placed in the proximity of the receive coil 33 in order to amplify the MR signals detected by it at a high signal-to-noise (S/N) ratio. Note here that use may be made of a transmit/receive coil in which the functions of the transmit and receive coils 31 and 33 are combined. In that case, the transmit/receive coil is connected to the transmitter 33 and the receiver 34 through a hybrid circuit or a switching unit for switching between transmission and reception.

Figure 4:
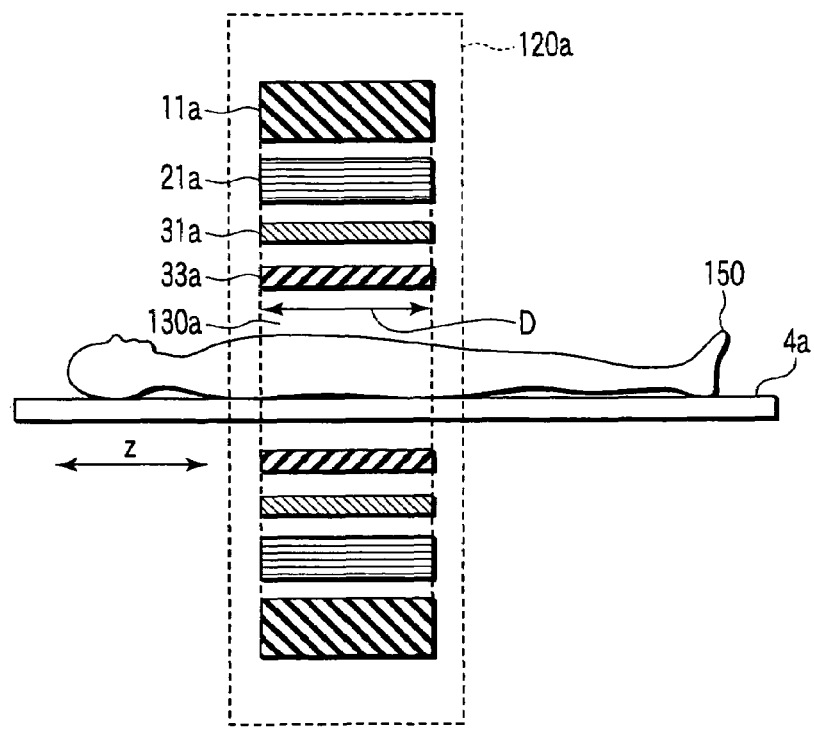
FIG. 4 is a schematic illustration of coils set in the gantry of a conventional MRI apparatus.

The main magnet 11, the gradient field coil 21, the transmit coil 31 and the receive coil 33 are also set in the gantry of the MRI apparatus 20 as shown in FIG. 4. The imaging field is formed in the central portion of the gantry. That is, in the center of the gantry is set the imaging field to which the subject 150 is allowed to have access together with the top board 4. Around the imaging field, the receive coil 33, the transmit coil 31, the gradient field coil 21 and the main magnet 11 are each arranged coaxially with the Z axis.

The top board 4 is mounted on the couch (not shown) placed in the proximity of the gantry so that it can slide along the Z axis. The direction of length of the top board 4 substantially coincides with the Z-axis direction. The subject 150 is placed on the top board 4 in a state where its body axis is made substantially coincident with the direction of length of the top board. By moving the top board 4, an arbitrary imaging region of the subject 150 is positioned on it is positioned within the imaging field. In this case, the imaging region positioned within the imaging field and the receive coil 33 face each other.

The top board moving unit 5 is attached to the above-described couch, for example. The top board moving unit 5 includes a movement mechanism 51 and a drive signal generator 52. The movement mechanism 51 includes a motor 51a to move the top board 4 at a predetermined speed in the direction of Z axis. The drive signal generator 32 produces a drive signal to drive the motor 51a on the basis of trigger signals (a trigger signal for initiating movement and a trigger signal for stopping movement) from the controller 9.

The image data producing unit 6 includes a storage 61 and a high-speed operation unit 62. The storage 61 includes an MR signal storage 611 and an image data storage 612. The MR signal storage 611 stores N channels of A/D converted MR signals from the receiver 34. The MR signal storage 611 stores MR signals repeatedly received for each imaging region while the subject 150 is moved. The MR signal storage 611 further stores imaging region position information from the controller 9 as supplementary information with correspondence established between it and MR signals for each imaging region. The image storage 612 stores image data reconstructed on the basis of MR signals and corresponding imaging region position information. The high-speed operation unit 62 reads MR signals and corresponding imaging region position information from the MR signal storage 611 and then performs two-dimensional Fourier transform on them to reconstruct image data. The high-speed operation unit has a function of producing image data relating to a larger region than the imaging field on the basis of MR signals obtained for different imaging regions.

The display unit 7 includes a display data producing circuit, a conversion circuit, and a monitor. The display data producing circuit produces display data by combining image data stored in the image data storage 12 and supplementary information, such as information of a subject, which is supplied from the input unit 8 through the control unit 9. The conversion circuit converts the display data into a given display format and then performs digital-to-analog (D/A) conversion and television format conversion to produce a video signal. The monitor displays a video the video signal represents. As the monitor use may be made of an existing display device, such as a cathode-ray tube (CRT) or a liquid-crystal display panel.

The input unit 8 is equipped on an operator console with various input devices, such as switches, a keyboard, a mouse, etc., and a display panel. The input device is used to input information of a subject, set up MR signal collecting conditions and image data display conditions, set the speed at which the top board 4 is to be moved, enter various commands, etc.

The controller 9 includes a main controller 91, a sequence controller 92, and a movement controller 93. The main controller 91, which includes a CPU and a storage circuit, controls the MRI apparatus 200. The storage circuit in the main controller 91 is stored with information concerning a subject, MR signal collecting conditions, image data display conditions, the speed of movement and the like, which are input or set up at the input unit 8. The CPU in the main controller 91 produces pulse sequence information on the basis of the above information and sends it to the sequence controller 92. The sequence information is information concerning the magnitudes, the application times and the application timing of pulsed currents to the gradient field coil 21 and the transmit coil 31. The sequence controller 92 includes a CPU and a storage circuit. The storage circuit in the sequence controller 92 stores the pulse sequence information from the main controller 91. The CPU in the sequence controller 92 produces a sequence control signal in accordance with the pulse sequence information to thereby control the gradient power supply 22 and the transmitter 32. The movement controller 93 responds to the pulse sequence information from the main controller 91 or the sequence control signal from the sequence controller 92 to produce trigger signals to initiate and stop the movement of the top board 4, which in turn are applied to the movement mechanism 5. For example, the movement controller 93 produces the trigger signals to initiate and stop the movement of the top board on the basis of times of starting and ending the MR signal acquisition set by the sequence controller 92.

The operation of the MRI apparatus 200 configured as described above will be described below with reference to FIG. 2, which is a timing diagram illustrating a relationship between a time interval in which an MR signal is acquired and a time interval in which a drive signal is produced in the MRI apparatus 200. To simplify the description, suppose that the MRI apparatus 200 is adapted for single-slice imaging. It should be noted, however, that the principles of the invention are also applicable to multiple-slice imaging and oblique imaging.

The gradient power supply 22 controls pulsed currents to the coils corresponding to the X-, Y- and Z-axes in the gradient field coil 21 in accordance with a sequence control signal from the sequence controller 92. Thereby, the imaging field is supplied with the slice-selection gradient field Gs, the phase-encoding gradient field Ge, and the readout (frequency encoding) gradient field Gr. The slice-selection gradient field Gs determines an imaging slice plane. The phase-encoding gradient field Ge and the readout gradient field Gr encode the MR signal obtained from the slice plane on the basis of the its emitted position.

For example, to produce image data of Na×Na, application of the phase-encoding gradient field Gr having Na different strengths is repeated Na times at a repetition time TR and application of the readout (frequency-encoding) gradient field Gr having a given strength is repeated at a repetition time TR.

The transmitter 32 applies the 90° RF pulse signal to the transmit coil 31 during the application of a first slice-selection gradient field Gs. The transmit coil 31 transmits the 90° RF pulse as a result of application of the 90° RF pulse signal. This 90° RF pulse is applied to a region of the subject 150 located within the imaging field. The transmitter 32 transmits a 180° RF pulse signal to the transmit coil 31 during the application of a second slice-selection gradient field Gs after a time of TE/2 from the transmission of the 90° RF pulse. The transmit coil 31 transmits the 180° RF pulse as a result of application of the 180° RF pulse signal. This 180° RF pulse is applied to that region applied with the 90° RF pulse. The receive coil 33 and the receiver 34 receive an MR signal emitted from the subject 150 after a time of TE/2 from application of the 180° RF pulse.

Na number of MR signals will be acquired by updating the strength of the phase-encoding gradient field Ge Na times. The high-speed operation unit 92 then carries out an operation of two-dimensional Fourier transform on the Na number of MR signals each having Na data points to produce image data of Na×Na pixels.

Figure 2:
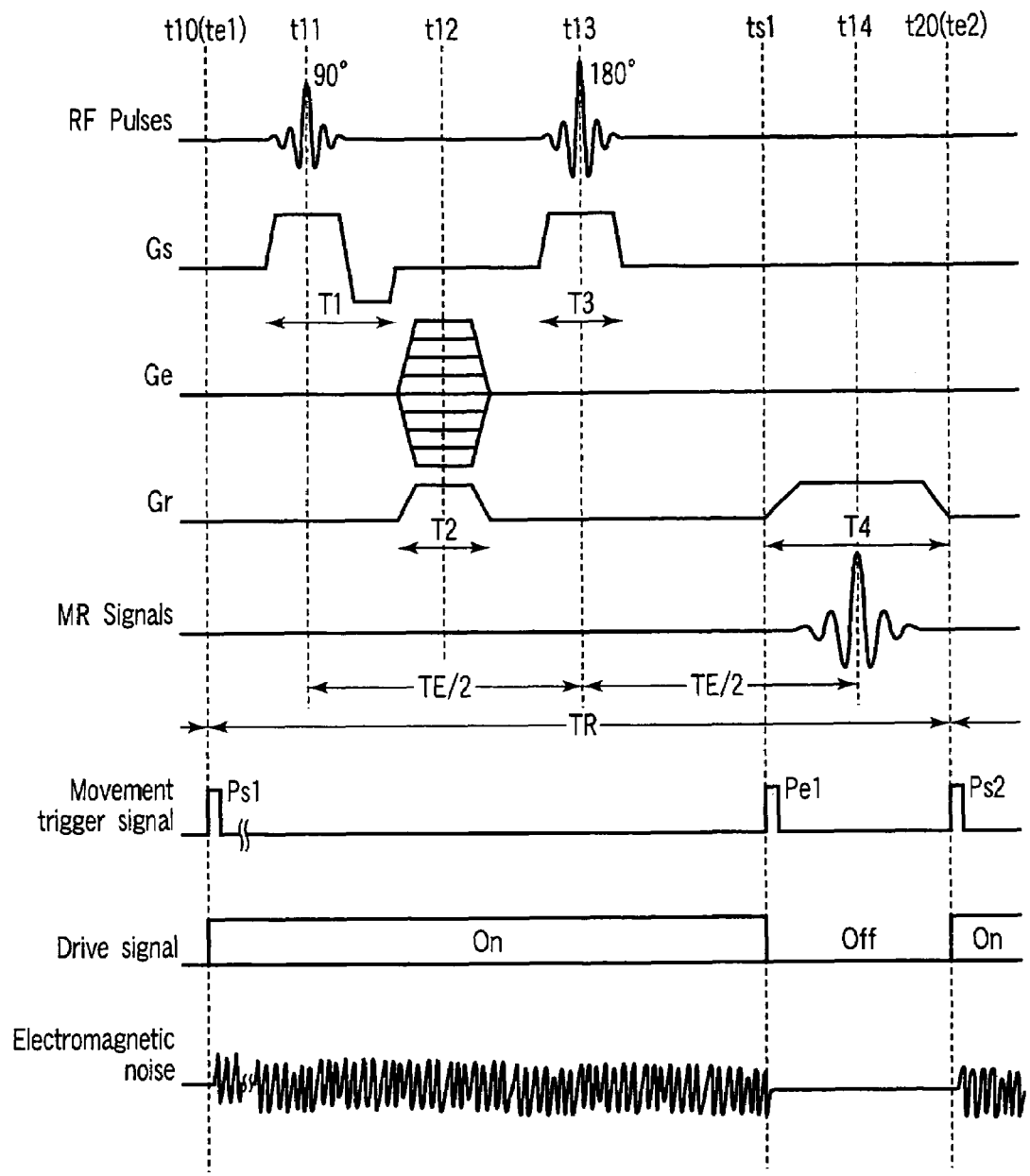
FIG. 2 is a diagram for use in explanation of a relationship between the MR signal acquisition interval and the drive signal generation interval in the MRI apparatus of FIG. 1.

The sequence of the RF pulses, the slice-selection gradient field Gs, the phase-encoding gradient field Ge and the readout gradient field Gr as shown in FIG. 2 conforms to the pulse sequence in the normal SE method. The MR signal shown in FIG. 2 schematically indicates an MR signal emitted in the subject 150 under that pulse sequence. The 90° and 180° RF pulses shown in FIG. 2 are RF waves for supplying nuclear spins in tissues of the subject with energy required to change them by 90° and 180°. The time TE is the time which elapses after the application of a 90° RF pulse before MR signals are detected. The time TR is the MR signal detecting interval (i.e., an MR signal is detected every TR).

At a time t10, the movement controller 93 generates a movement initiating trigger signal Ps1. The time t10 is a time prior to application of the subject 150 with a 90° RF pulse and a slice-selection gradient field Gs (for example, the time that the last acquisition of an MR signal was completed). In the movement mechanism 5, upon receiving the movement initiating trigger signal Ps1 the drive signal generator 52 starts generating a drive signal. When this drive signal is applied to the motor 51a, the top board 4 is moved by the movement mechanism 51 at a given speed in the direction of Z axis. While the drive signal is applied to the motor, electromagnetic noise is generated due to the drive signal as shown in FIG. 2.

Next, during an interval T1 including a time t11 after the time t10, a slice-selection gradient field Gs and a 90° RF pulse are applied to the imaging field. During an interval T2 including a time t12 after time the t11, a phase encoding gradient field Ge and a frequency encoding gradient field Gr are applied to the imaging field.

During an interval T3 including a time t13 after a lapse of TE/2 from the time t11, a second slice-selection gradient field Gs and a 180° RF pulse are applied to the imaging field. During an interval T4 including a time t14 after a lapse of TE/2 from the time t13, a readout gradient field Gr is applied again to the imaging field, whereby MR signals are collected.

In collecting MR signals in accordance with such a sequence, the movement controller 93 generates a movement stopping trigger signal Pe1 at the time ts1 in the interval T4 when application of the readout gradient field Gr is initiated. In response to the movement stopping trigger signal Pe1, the drive signal generator 32 in the movement mechanism 5 stops the generation of the drive signal. Thus, the application of the drive signal to the motor 51a is stopped. Then, at a time Te2 in the interval T4 when the application of the readout gradient field Gr is stopped, the movement controller 83 generates a movement initiating trigger signal Ps2. In response to the trigger signal Ps2, the drive signal generator 52 resumes the generation of a drive signal.

By repeating the operation described above, while moving the subject 150 in the imaging field (while a to-be-imaged region of the subject is changed), the MRI apparatus acquires MR signals emitted from each region of the subject in time sequence. Based on the MR signals thus acquired, the high-speed operation unit 63 reconstructs image data representing a region of the subject which is larger in size than the imaging field.

During the interval T4 in which the readout gradient field Gr is applied, the application of the drive signal to the motor 51a is stopped. Therefore, electromagnetic noise caused by the drive signal is not generated at the MR signal acquisition time as shown in FIG. 2, thus preventing the noise from getting mixed in MR signals. For this reason, it becomes possible to produce image data which has few artifacts and is excellent in the S/N ratio.

The interval T4 is usually 10 msec or so; thus, the interval in which the movement of the top board 4 is stopped is very short. Thus, the stoppage of movement of the top board 4 will little cause the subject to suffer from an unpleasant feeling. When inertia occurs in the movement mechanism 51, it is possible to continuously move the top board even during the interval when the application of the drive signal is stopped.

According to the embodiment, no electromagnetic noise which may get mixed in MR signals is generated; thus, it becomes possible to provide imaging which is not affected by electromagnetic noise even with MRI apparatus having a gantry structured such that the length of the imaging field is reduced or the aperture is made large.

The embodiment can be variously modified as follows:

MR signals, while being greatly affected by electromagnetic noise caused by such a drive signal as described above, may be affected by noise caused by separate electronic circuits such as logic circuits built in the display unit 7 and the input unit 8. Thus, mixing of noise in MR signals can be further reduced by disabling such electronic circuits as with the drive signal generator 52.

As the receive coil 33, use may be made of a single coil as opposed to an array coil. In this case, although the receiving sensitivity deteriorates in comparison with the embodiment, the receive coil 33 and the receiver 34 can be made simple in construction.

Figure 3:
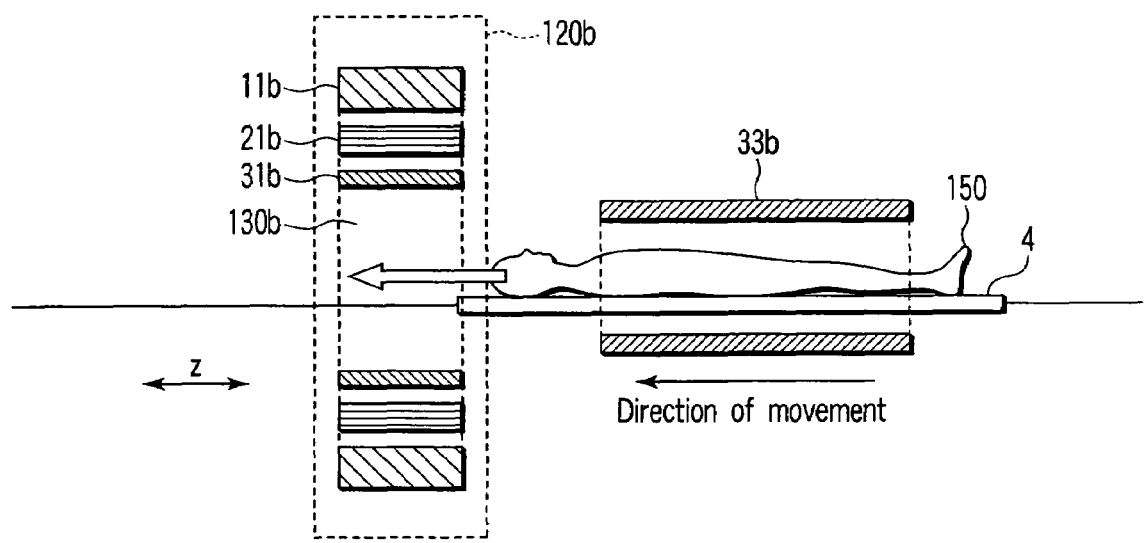
FIG. 3 shows another embodiment.

As an alternative to the receive coil 33 in the embodiment, use may be made of a receive coil 33b which is fixed to the top board 4 so as to surround the whole of a to-be-imaged region of the subject 150 as shown in FIG. 3. In this case, the receive coil 33b is continuously moved in the imaging field 130b of the gantry 120b together with the top board 4, allowing MR signals to be received from a large region of the subject and large-volume imaging to be realized. In this case as well, it is possible to use a single coil as the receive coil 33b though an array coil is normally used.

The top board 4 may be moved in steps at regular intervals. In this case, image data for a large region can be produced by producing image data in each of preset imaging positions and then combining these image data.

In the above-described embodiment, as the image data producing method which allows large-volume imaging while a subject is continuously moved, it is desirable to use a method which traces and repeatedly excites a plane section of the continuously moving subject and collects all echoes required to reconstruct one image from that plane section while changing the RF pulse frequency according to the position of the continuously moving plane section within the imaging field. Instead of this method, use may be made of a method described in U.S. Pat. No. 7,110,805. These methods are incorporated herein. However, other methods than these methods may be used. For example, the former method may be modified so as not to change the RG pulse frequency according to the position of the continuously moving plane section.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus which is configured to:
    apply RF pulses to a subject placed on a support which is moving in an imaging field in which a static magnetic field and gradient magnetic fields are formed;
    acquire magnetic resonance signals emitted from the subject as a result of application of the RF pulses;
    produce image data based on the acquired magnetic resonance signals; and
    stop the generation of a drive signal to move the support during a magnetic resonance signal acquisition interval.

2. A magnetic resonance imaging apparatus comprising:
    a magnetic field forming unit which forms a static magnetic field and gradient magnetic fields in an imaging field of magnetic resonance imaging;
    a support on which a subject is placed;
    a support moving unit which moves the support;
    a transmitting and receiving unit which applies RF pulses to a to-be-imaged region of the subject positioned in the imaging field and receives magnetic resonance signals emitted from the to-be-imaged region of the subject;
    an image data producing unit which produces image data on the basis of the magnetic resonance signals; and
    a drive signal generator which generates a drive signal for driving the support moving unit so as to cause the support to move and stops the generation of the drive signal during an interval in which the magnetic resonance signals are received by the transmitting and receiving unit.

3. The apparatus according to claim 2, wherein the support moving unit moves the support continuously or in steps at regular intervals.

4. The apparatus according to claim 2, wherein the support moving unit moves the support in the direction of the body axis of the subject, and
    the transmitting and receiving unit applies RF pulses to each of to-be-imaged regions of the subject which are positioned in succession in the imaging field as a result of movement of the support and receives magnetic resonance signals emitted from each of the to-be-imaged regions of the subject.

5. The apparatus according to claim 4, wherein the support moving unit moves the support continuously or in steps at regular intervals.

6. The apparatus according to claim 2, wherein the support moving unit stops the movement of the support as the result of the generation of the drive signal being stopped during an interval in which the transmitting and receiving unit receives magnetic resonance signals.

7. The apparatus according to claim 2, wherein the image data producing unit produces image data for a large region of the subject which contains the to-be-imaged regions on the basis of magnetic resonance signals obtained from each of the to-be-imaged regions.

8. The apparatus according to claim 2, further comprising a trigger signal generator which generates a support movement initiation trigger signal and a support movement stopping trigger signal on the basis of information concerning the timing of starting and ending of application of the gradient magnetic fields, and
    wherein the drive signal generator sets an interval in which the generation of the drive signal is stopped on the basis of the support movement initiation trigger signal and the support movement stopping trigger signal.

9. The apparatus according to claim 8, wherein the trigger signal generator generates the support movement initiation trigger signal and the support movement stopping trigger signal on the basis of information concerning the timing of starting and ending of application of a readout gradient magnetic field of the gradient magnetic fields which is applied at the time of receiving the magnetic resonance signals.

10. A magnetic resonance imaging apparatus comprising:
an application unit which applies gradient magnetic fields and radio-frequency pulses to a subject placed in a static magnetic field in order to emit magnetic resonance signals from the subject;
a couch which causes a support on which the subject is placed to move in a longitudinally direction of the support during image acquisition along a field of view which is larger than that of the application unit;
a radio-frequency coil which detects the magnetic resonance signals;
a data acquisition unit which acquires the magnetic resonance signals detected by the radio-frequency coil;
a reconstruction unit which reconstructs a magnetic resonance image of said larger field of view on the basis of the magnetic resonance signals acquired by the data acquisition unit; and
a controller which controls the application unit and the data acquisition unit so as to acquire the magnetic resonance signals while a drive signal to drive the support is turned off.

11. The apparatus according to claim 10, wherein the controller controls the application unit to apply the gradient magnetic fields and the RF pulses while the drive signal is turned on and controls the data acquisition unit to acquire the magnetic resonance signals while the drive signal is turned off.

12. A magnetic resonance imaging apparatus comprising:
an application unit which applies gradient magnetic fields and radio-frequency pulses to a subject placed in a static magnetic field in order to emit magnetic resonance signals from the subject;
a couch which causes a support on which the subject is laid down to move in the direction of its length;
a radio-frequency coil which detects the magnetic resonance signals;
a data acquisition unit which acquires the magnetic resonance signals detected by the radio-frequency coil;
a reconstruction unit which reconstructs a magnetic resonance image on the basis of the magnetic resonance signals acquired by the data acquisition unit; and
a controller which controls the application unit, the couch and the data acquisition unit so as to acquire the magnetic resonance signals while moving the support, the couch being controlled so as not to generate a drive signal to move the support during an interval in which the magnetic resonance signals are acquired by the data acquisition unit.

13. A magnetic resonance imaging apparatus which applying RF pulses to a subject placed on a support which is moving in an imaging field in which a static magnetic field and gradient magnetic fields are formed;
acquiring magnetic resonance signals emitted from the subject as a result of application of the RF pulses;
producing image data based on the acquired magnetic resonance signals; and
temporarily stopping an operation which is required for at least some portion of an MRI data acquisition sequence, but which involves generation of noise in the magnetic resonance signals during a magnetic resonance signal acquisition interval.

14. A magnetic resonance imaging apparatus comprising:
a magnetic field forming unit which forms a static magnetic field and gradient magnetic fields in the imaging field of the magnetic resonance imaging;
a transmitting and receiving unit which applies RF pulses to a to-be-imaged region of a subject positioned in the imaging field and receives magnetic resonance signals emitted from the to-be-imaged region of the subject;
an image data producing unit which produces image data on the basis of the magnetic resonance signals; and
an operation unit which involves an operation which takes place during MRI data acquisition, but causes noise to be generated in the magnetic resonance signals, the operation being temporarily stopped during an interval in which the magnetic resonance signals are received by the transmitting and receiving unit.

15. A method for MR imaging, comprising:
applying RF pulses to a subject placed on a support which is moving in an imaging field in which a static magnetic field and gradient magnetic fields are formed;
acquiring magnetic resonance signals emitted from the subject as a result of application of the RF pulses;
producing image data based on the acquired magnetic resonance signals; and
temporarily stopping the generation of a drive signal to move the support during a magnetic resonance signal acquisition interval.

16. A method according to claim 15, wherein the support is moved continuously or in steps at regular intervals.

17. A method according to claim 15, wherein:
the support moves in the direction of the body axis of the subject;
RF pulses are applied to each of to-be-imaged regions of the subject which are positioned in succession in the imaging field as a result of movement of the support; and
magnetic resonance signals emitted from each of the to-be-imaged regions of the subject are received when support drive signals are not occurring.

18. A method according to claim 17, wherein the support moves continuously or in steps at regular intervals.

19. A method according to claim 15, wherein the support stops movement when the drive signal is stopped during an interval in which magnetic resonance signals are being received.

20. A method according to claim 15, wherein image data for a large region of the subject which contains the to-be-imaged region is produced on the basis of magnetic resonance signals obtained from each of the to-be-imaged regions.

21. A method according to claim 15, further comprising generating a support movement initiation trigger signal and a support movement stopping trigger signal on the basis of information concerning the timing of starting and ending of application of the gradient magnetic fields, and
wherein an interval is set in which the generation of the drive signal is stopped on the basis of the support movement initiation trigger signal and the support movement stopping trigger signal.

22. A method according to claim 21, wherein the support movement initiation trigger signal and the support movement stopping trigger signal are generated on the basis of information concerning the timing of starting and ending of application of a readout gradient magnetic field of the gradient magnetic fields which is applied at the time of receiving the magnetic resonance signals.

* * * * *